(12) United States Patent
Park et al.

(10) Patent No.: US 11,869,903 B2
(45) Date of Patent: *Jan. 9, 2024

(54) METHOD OF MANUFACTURING DISPLAY APPARATUS

(71) Applicant: Samsung Display Co., LTD., Yongin-si (KR)

(72) Inventors: Jonghee Park, Hwaseong-si (KR); Jin Seock Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/554,078

(22) Filed: Dec. 17, 2021

(65) Prior Publication Data

US 2022/0109011 A1 Apr. 7, 2022

Related U.S. Application Data

(62) Division of application No. 16/832,613, filed on Mar. 27, 2020, now Pat. No. 11,227,880.

(30) Foreign Application Priority Data

Aug. 21, 2019 (KR) .......................... 10-2019-0102425

(51) Int. Cl.
*H01L 27/12* (2006.01)
*H01L 21/3213* (2006.01)
*H10K 59/12* (2023.01)

(52) U.S. Cl.
CPC .... *H01L 27/1259* (2013.01); *H01L 21/32134* (2013.01); *H01L 21/32139* (2013.01); *H10K 59/12* (2023.02); *H10K 59/1201* (2023.02)

(58) Field of Classification Search
CPC ........... H01L 27/1259; H01L 21/32134; H01L 21/32139; H10K 59/12; H10K 59/1201
USPC ........................................................... 438/23
See application file for complete search history.

(56) References Cited

U.S. PATENT DOCUMENTS

| 7,718,348 | B2 | 5/2010 | Chang |
| 8,756,560 | B2 | 6/2014 | Takada |
| 2007/0097306 | A1* | 5/2007 | Jung ..................... G02F 1/1345 |
| | | | 349/143 |
| 2016/0071726 | A1 | 3/2016 | Mizuno et al. |
| 2017/0288167 | A1* | 10/2017 | Hanari ............... H10K 50/8423 |
| 2019/0157363 | A1* | 5/2019 | Lee ..................... H01L 27/1255 |

* cited by examiner

*Primary Examiner* — Dzung Tran
(74) *Attorney, Agent, or Firm* — KILE PARK REED & HOUTTEMAN PLLC

(57) ABSTRACT

A method of manufacturing a display apparatus includes forming a first conductive layer on a base substrate including a panel area and a margin area disposed next to the panel area, the margin area including a dummy pattern area, forming a photoresist layer on the first conductive layer, forming a photoresist pattern by exposing and developing the photoresist layer, forming a first conductive pattern by etching the first conductive layer using the photoresist pattern, and removing the photoresist pattern. The forming the first conductive pattern includes forming a first pixel circuit pattern in the panel area, and forming a dummy pattern in the dummy pattern area of the margin area. An opening ratio of a portion where the dummy pattern is not formed with respect to the dummy pattern area is about 30% or more.

4 Claims, 8 Drawing Sheets

METHOD OF MANUFACTURING DISPLAY APPARATUS

CROSS-REFERENCE TO RELATED APPLICATION(S)

This is a divisional application of U.S. patent application Ser. No. 16/832,613, filed Mar. 27, 2020, now issued as U.S. Pat. No. 11,227,880, the disclosure of which is incorporated herein by reference in its entirety. U.S. patent application Ser. No. 16/832,613 claims priority to and benefit of Korean Patent Application No. 10-2019-0102425 under 35 U.S.C. § 119, filed on Aug. 21, 2019, in the Korean Intellectual Property Office, the entire contents of which are incorporated herein by reference.

BACKGROUND

1. Field

Embodiments relate to a method of manufacturing a display apparatus having a dummy pattern in a margin area.

2. Description of the Related Art

Light weight and small display apparatus are being manufactured. A cathode ray tube (CRT) display apparatus has been used in the past due to performance and a competitive price. However the CRT display apparatus has a weakness in terms of size and portability. Therefore, a display apparatus such as a plasma display apparatus, a liquid crystal display apparatus and an organic light emitting display apparatus has been highly regarded due to its small size, light weight and low-power-consumption.

In manufacturing a display apparatus, after forming multiple conductive layers and insulating layers on a mother substrate including a panel area and a margin area that may surround the panel area, the margin area is cut off from the panel area, so that the panel area can be separated from the mother substrate. Various patterns may be formed in the margin area. In order to improve the quality of the display apparatus, it is necessary to improve the design of the margin area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are provided for a method of manufacturing a display apparatus improving display quality.

According to an embodiment, a method of manufacturing a display apparatus may include forming a first conductive layer on a base substrate including a panel area and a margin area (or referred to as a peripheral area) disposed next to the panel area, the margin area including a dummy pattern area, forming a photoresist layer on the first conductive layer, forming a photoresist pattern by exposing and developing the photoresist layer, forming a first conductive pattern by etching the first conductive layer using the photoresist pattern, and removing the photoresist pattern. The forming the first conductive pattern includes forming a first pixel circuit pattern in the panel area, and forming a dummy pattern in the dummy pattern area of the margin area. An opening ratio of a portion where the dummy pattern is not formed with respect to the dummy pattern area is about 30% or more.

In an embodiment, the opening ratio of the dummy pattern area may be about 60% or less.

In an embodiment, the dummy pattern may have a repeating pattern and is uniformly formed with respect to the entire dummy pattern area.

In an embodiment, the dummy pattern may have a shape in which multiple rectangles may be arranged along a first direction and a second direction perpendicular to the first direction.

In an embodiment, a distance between neighboring rectangles of the dummy pattern may be more than about 20 µm (micrometer).

In an embodiment, the margin area may include a dummy active area. The method further may include forming an active layer including an active pattern of a thin film transistor in the panel area and a dummy active pattern in the dummy active area.

In an embodiment, the dummy active area may be between the panel area and the dummy pattern area.

In an embodiment, the margin area may include an edge area at an edge of the base substrate. The dummy pattern area may be between the edge area and the panel area, and the first conductive pattern may not be formed in the edge area.

In an embodiment, the forming the first conductive pattern may include wet etching the first conductive layer using an organic acid etchant.

In an embodiment, the forming the first pixel circuit pattern of the first conductive pattern may include forming a gate electrode or source and drain electrodes of a thin film transistor.

In an embodiment, the first conductive layer may include at least one of gold, silver, aluminum, platinum, nickel, titanium, palladium, magnesium, calcium, lithium, chromium, tantalum, molybdenum, scandium, neodymium, iridium, alloy containing aluminum, aluminum nitride, alloys containing silver, tungsten, tungsten nitride, alloys containing copper, alloys containing molybdenum, titanium nitride, tantalum nitride, strontium ruthenium oxide, zinc oxide, indium tin oxide, tin oxide, indium oxide, gallium oxide, and indium zinc oxide.

In an embodiment, the forming the first pixel circuit pattern of the first conductive pattern may include forming a pixel electrode electrically connected to a thin film transistor.

In an embodiment, the forming the first conductive layer may include forming a layer containing silver (Ag).

In an embodiment, the forming the first conductive layer may include forming a layer comprising at least one indium tin oxide, and forming a layer comprising at least one silver (Ag).

In an embodiment, the method may further include forming a light emitting layer and an opposite electrode on the pixel electrode.

In an embodiment, the method may further include forming an insulating layer on the first conductive pattern, and forming a second conductive pattern on the insulating layer.

In an embodiment, the forming the second conductive pattern may include forming a second pixel circuit pattern in the panel area, and forming a second dummy pattern in the dummy pattern area of the margin area.

In an embodiment, the method may further include cutting the margin area of the base substrate to separate the margin area from the panel area.

According to an embodiment, a method of manufacturing a display apparatus may include forming a thin film transistor in a panel area on a base substrate including the panel area and a margin area disposed next to the panel area, forming a conductive layer on the base substrate on which the thin film transistor is formed, patterning the conductive layer to form a dummy pattern in the margin area and a pixel electrode electrically connected to the thin film transistor in the panel area, forming a light emitting layer and an opposite electrode on the pixel electrode, and cutting the margin area of the base substrate to separate the margin area from the panel area.

In an embodiment, the forming the conductive layer may include forming a layer containing silver (Ag).

In an embodiment, the patterning the conductive layer may include forming a photoresist layer on the conductive layer, forming a photoresist pattern by exposing and developing the photoresist layer, and forming the pixel electrode and the dummy pattern by etching the conductive layer using the photoresist pattern.

In an embodiment, the etching the conductive layer may include wet etching the conducive layer using an organic acid based etching solution According to an embodiment, a dummy pattern may be formed in a dummy pattern area. An opening ratio of a portion where the dummy pattern is not formed with respect to the dummy pattern area may be about 30% or more. The dummy pattern may alleviate a loading effect in case that the photoresist layer is developed. Since the opening ratio of the dummy pattern region in which the dummy pattern is formed is about 30% or more, even a low skew etchant such as an organic acid etchant may be used to manufacture a display apparatus having excellent quality without residues.

It is to be understood that both the foregoing general description and the following detailed description are exemplary and explanatory and are intended to provide further explanation of the invention as claimed.

BRIEF DESCRIPTION OF THE DRAWINGS

The embodiments will be described in detail with reference to the accompanying drawings, in which.

DETAILED DESCRIPTION OF THE EMBODIMENTS

Figure 1:
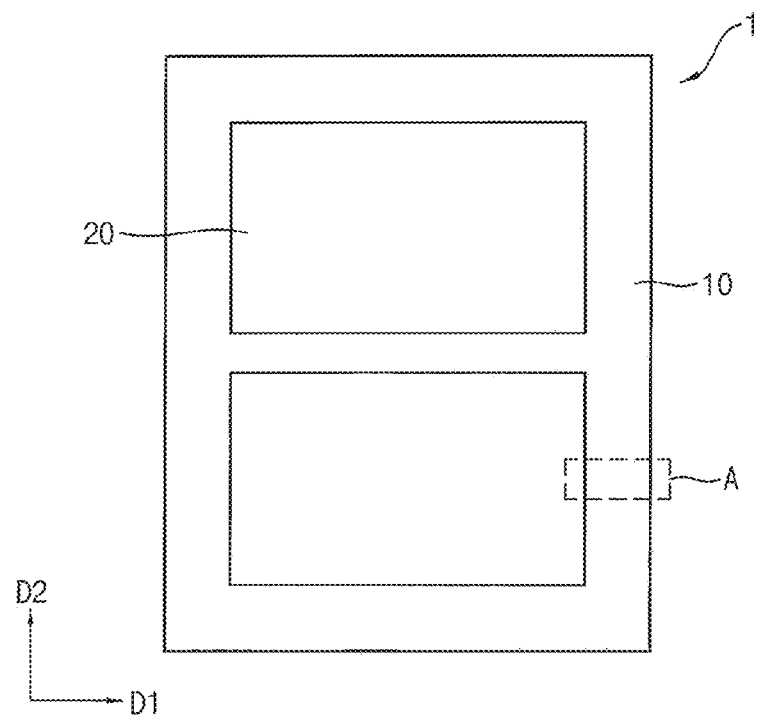
FIG. 1 is a schematic plan view of a mother substrate in a method of manufacturing a display apparatus according to an embodiment.

Hereinafter, the embodiments will be explained in detail with reference to the accompanying drawings.

In the drawings, sizes and thicknesses of elements may be enlarged for clarity and ease of description thereof. However, the disclosure is not limited to the illustrated sizes and thicknesses.

The singular forms "a," "an," and "the" are intended to include the plural forms as well, unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Operations described may be in the order presented in an embodiment, but may be in a different order in a different embodiment. As with other features, an operation may be combined in a different embodiment, and an operation may be separated in another embodiment.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a mother substrate in a method of manufacturing a display apparatus according to an embodiment.

Referring to FIG. 1, the mother substrate 1 may include a panel area 20 and a margin area 10.

The panel area 20 may include a display area and a non-display area. Gate lines, data lines crossing the gate lines, thin film transistors and pixel electrodes electrically connected to the gate lines and the data lines may be formed in the display area on a base substrate. Pixels PX may be arranged in a matrix and may display an image in the display area. A pad that may provide a driving signal to the gate line and the data line, and a driving circuit may be formed in the non-display area.

In case that the display apparatus is an organic light emitting display apparatus, a light emitting structure or the like may be further formed in the panel area 20. In case that the display apparatus is a liquid crystal display apparatus, a liquid crystal layer or the like may be further formed after the panel area 20 may be separated from the mother substrate 1.

In an embodiment, one panel area 20 may be formed in one mother substrate (mother glass) 10. However, as shown in FIG. 1, multiple panel areas 20 corresponding to multiple display apparatus may be formed in one mother substrate 1. The mother substrate 1 may have a size larger than one panel area 20. As shown in FIG. 1, two panel areas 20 may be formed in one mother substrate 1, but the disclosure is not limited thereto. For example, multiple panel areas corresponding to multiple display apparatuses that may be of the same model may be formed on one mother substrate. As another example, a different number of panel areas corresponding to display apparatuses of one or more different models may be formed on one mother substrate.

The margin area 10 may be disposed adjacent or next to the panel area 20. For example, the margin area 10 may surround the panel area 20. As the panel area 20 is separated from the mother substrate 1 through a cutting process or the like, the margin area 10 may be an area that does not remain in the display apparatus of a final product.

In the margin area 10, various patterns may be formed due to a necessity of the process of manufacturing the display apparatus. A detailed description thereof will be described later with reference to FIG. 2.

According to a method of manufacturing the display apparatus, the mother substrate 1 including a base substrate may be prepared, and the active layer or the metal layer and the photoresist layer may be sequentially deposited on the display area 20 and the margin area 10. The photoresist layer may be exposed and developed to form a photoresist pattern. The display apparatus may be manufactured by patterning the active layer or the metal layer using the photoresist pattern as an etch barrier.

In the process of etching the metal layer of the mother substrate 1, the metal layer can be removed by a dip method of immersing the mother substrate 1 (e.g., the entire mother substrate) in a container containing an etchant or a spray method of spraying the etching liquid on the mother substrate 1 (e.g., from above the mother substrate 1) using a spray device.

Figure 2:
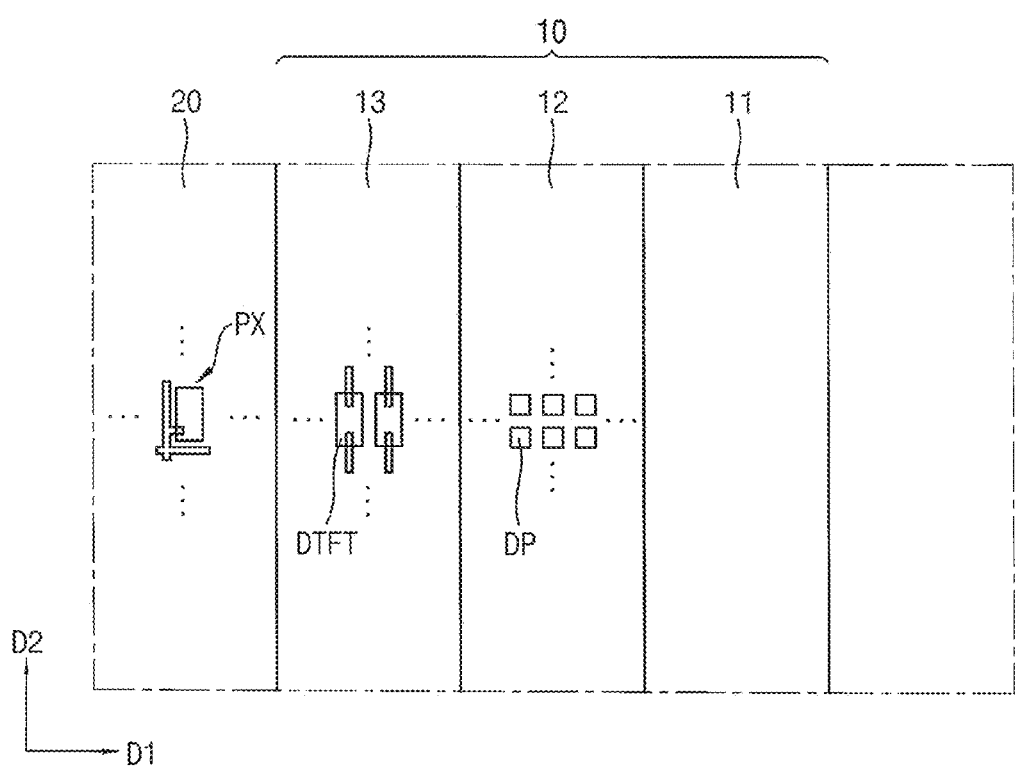
FIG. 2 is a partially enlarged schematic plan view illustrating portion A which may include a portion of the margin area of the mother substrate of FIG. 1.

FIG. 2 is a partially enlarged schematic plan view illustrating portion A which may include a portion of the margin area of the mother substrate of FIG. 1.

Referring to FIGS. 1 and 2, the margin area 10 may include an edge area 11, a dummy pattern area 12, and a dummy active area 13.

The dummy active area 13 may be disposed adjacent to the panel area 20. The edge area 11 may be disposed at an edge (or an outermost edge) of the mother substrate 1. The dummy pattern area 12 may be disposed between the dummy active area 13 and the edge area 11.

In the dummy active area 13, a dummy thin film transistor DTFT may be formed. The dummy thin film transistor DTFT may be formed to inspect characteristics of the thin film transistor in the panel area 20.

The edge area 11 may be an outermost edge portion of the mother substrate, and no metal pattern or active pattern may be formed in the edge area 11.

A dummy pattern DP may be formed in the dummy pattern area 12. The dummy pattern DP may include a first dummy pattern DP1, a second dummy pattern DP2, and a third dummy pattern DP3 as a conductive layer (see, e.g., 3E).

The dummy pattern DP may be formed in order to prevent a deviation of a CD (critical dimension) of the photolithography process between the panel area 20 and the margin area 10.

For example, in the photoresist developing process, due to the amount of photoresist dissolved in a developer, a concentration of the developer may be non-uniform between the panel area 20 and the margin area 10. It may be possible to prevent non-uniform etching from occurring by positioning that considers this non-uniformity.

Since the dummy pattern DP may be disposed in the dummy pattern area 12 disposed between the dummy active area 13 and the edge area 11, during the development of the photoresist layer in the edge area 11, a loading effect may be alleviated to reduce an influence of the edge area 11 on the panel area 20 and the active dummy area 13.

The dummy pattern DP may be formed in an embodiment to have an opening ratio of about 30% or more in the dummy pattern area 12. The opening ratio may refer to the ratio of the area where the dummy pattern DP may not be formed with respect to the dummy pattern area 12. For example, the dummy pattern DP may be formed to have an area of about 70% or less in the dummy pattern area 12. The dummy pattern 12 may have a shape in which multiple rectangles may be arranged along a first direction D1 and a second direction D2 perpendicular to the first direction D1.

In consideration of a role of the dummy pattern DP, the dummy pattern DP may be formed in an embodiment to have an opening ratio of about 30% to about 60% in the dummy pattern area 12.

In case that the opening ratio of the dummy pattern area 12 is less than about 30%, the portion where the dummy pattern DP is not formed (i.e., the space between the rectangles) may be too narrow, so that a spacing of the photoresist pattern may be minutely formed. As a result, sufficient etching may not be performed and residues may be present, which may affect subsequent processes. For example, in the case of a low skew etchant such as an organic acid-based etching solution, such a problem may be more severe.

In case that the opening ratio is greater than about 60%, the amount of photoresist melted by the developer in the dummy pattern area 120 may increase. In developing the photoresist layer, the function of the dummy pattern DP of alleviating a loading effect may be degraded.

FIGS. 3A to 3E are schematic cross-sectional views illustrating a method of manufacturing a display apparatus according to an embodiment.

Figure 3A:
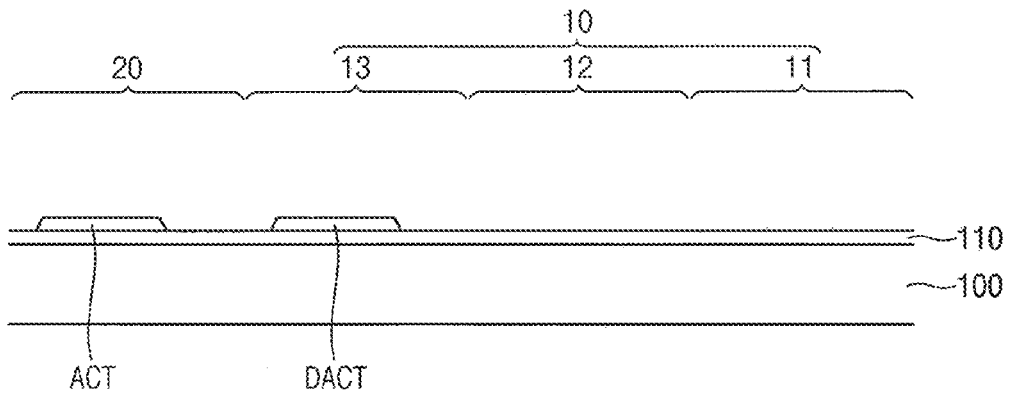
FIGS. 3A to 3E are schematic cross-sectional views illustrating a method of manufacturing a display apparatus according to an embodiment.

Referring to FIG. 3A, a buffer layer 110 may be formed on a base substrate 100.

The base substrate 100 may be made of a transparent or opaque material. For example, the base substrate 100 may be a quartz substrate, a synthetic quartz substrate, a calcium fluoride substrate, a fluorine-doped quartz substrate, a sodalime glass substrate, an alkali-free non-alkali glass substrate, or a combination thereof. In another embodiment, the base substrate 100 may be made of a transparent resin substrate. An example of the transparent resin substrate that can be used for the base substrate 100 may be a polyimide substrate.

The base substrate 100 may include a panel region 20 and a margin region 10. The panel area 20 may include a display area and a non-display area. The margin area 10 may be disposed next to (or surround) the panel area 20, and as the panel area 20 may be separated from the mother substrate 1 through a cutting process or the like, the margin area 10 may be an area that does not remain in the display apparatus of a final product. The margin area 10 may include an edge area 11, a dummy pattern area 12, and a dummy active area 13.

The dummy active area 13 may be disposed adjacent to the panel area 20. The edge area 11 may be disposed at an edge (or an outermost edge) of the mother substrate 1. The dummy pattern area 12 may be disposed between the dummy active area 13 and the edge area 11. The edge area 11 may be the outermost edge portion of the mother substrate.

The buffer layer 110 may prevent metal atoms or impurities from diffusing into an active pattern (described later) from the base substrate 100. The buffer layer 110 may control a heat transfer rate during a crystallization process to form the active pattern, thereby obtaining an active pattern which may be substantially uniform.

The active layer may be formed on the buffer layer 110. The active layer may include an active pattern ACT of the thin film transistor in the panel area 20 and a dummy active pattern DACT in the dummy active area 13.

Figure 3B:
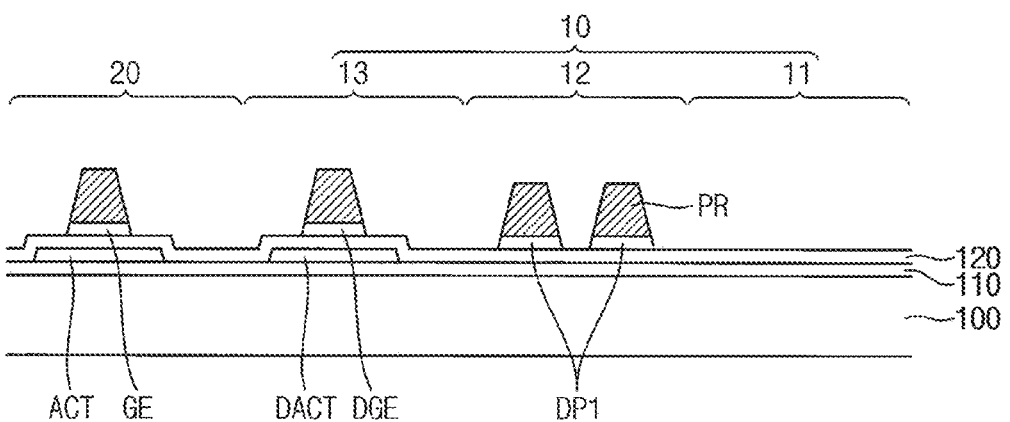

Referring to FIG. 3B, a first insulating layer 120 may be formed on the buffer layer 110 on which the active layer may be formed. The first insulating layer 120 may include an inorganic or organic insulating material. For example, the first insulating layer 120 may include an inorganic insulating material such as a silicon compound or a metal oxide such as silicon oxide and silicon nitride or a combination thereof. The first insulating layer 120 may be formed of layers. The first insulating layer 120 may be formed using a chemical vapor deposition process, a spin coating process, a plasma enhanced chemical vapor deposition process, a sputtering process, a vacuum deposition process, a high density plasma-chemical vapor deposition process, a printing process, or the like according to a constituent material.

A gate conductive layer may be formed on the first insulating layer 120. The gate conductive layer may include a gate electrode GE in the panel area 20, a dummy gate electrode DGE in the dummy active area 13, and a first dummy pattern DP1 in the dummy pattern area 12.

For example, a conductive layer may be formed on the first insulating layer 120. The conductive layer may include at least one of gold, silver, aluminum, platinum, nickel, titanium, palladium, magnesium, calcium, lithium, chromium, tantalum, molybdenum, scandium, neodymium, iridium, alloy containing aluminum, aluminum nitride, alloys containing silver, tungsten, tungsten nitride, alloys containing copper, alloys containing molybdenum, titanium nitride, tantalum nitride, strontium ruthenium oxide, zinc oxide, indium tin oxide, tin oxide, indium oxide, gallium oxide, and indium zinc oxide. The conductive layer may be formed using a printing process, a sputtering process, a chemical vapor deposition process, a pulsed laser deposition (PLD) process, a vacuum deposition process, an atomic layer deposition (ALD) process, or the like.

A photoresist layer may be formed on the conductive layer. The photoresist layer may be exposed and developed using a mask to form a photoresist pattern PR. The gate conductive layer may be formed by etching the conductive layer using the photoresist pattern PR as an etch barrier. The photoresist pattern PR may be removed through a strip process.

Since the opening ratio of the dummy pattern area 12 may be about 30% or more, even in case of using a low skew etchant such as an organic acid-based etching solution, sufficient etching may be performed so that no residues exist. Accordingly, even in case that the photoresist pattern PR is removed through a strip process, process residues may not remain.

By the first dummy pattern DP1 of the dummy pattern area 12, during the development of the photoresist layer in the edge area 11, a loading effect may be alleviated to reduce an influence of the edge area 11 on the panel area 20 and the active dummy area 13.

Figure 3C:
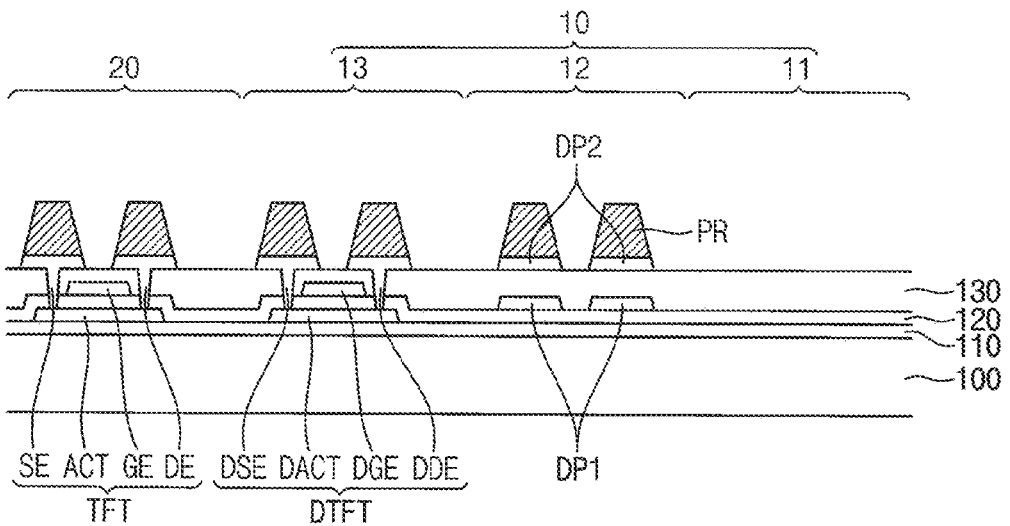

Referring to FIG. 3C, a second insulating layer 130 may be formed on the first insulating layer 120 on which the gate conductive layer may be formed.

The second insulating layer 130 may include an inorganic or organic insulating material. For example, the second insulating layer 130 may include an inorganic insulating material such as a silicon compound or a metal oxide such as silicon oxide and silicon nitride. The second insulating layer 130 may be formed of layers. The second insulating layer 130 may be formed using a chemical vapor deposition process, a spin coating process, a plasma enhanced chemical vapor deposition process, a sputtering process, a vacuum deposition process, a high density plasma-chemical vapor deposition process, a printing process, or the like according to a constituent material.

A source drain conductive layer may be formed on the second insulating layer 130. The source drain conductive layer may include a source electrode SE and a drain electrode DE in the panel area 20, a dummy source electrode DSE and a dummy drain electrode DDE in the dummy active area 13 and a second dummy pattern DP2 in the dummy pattern area 12.

For example, a conductive layer may be formed on the second insulating layer 130. The conductive layer may include at least one of gold, silver, aluminum, platinum, nickel, titanium, palladium, magnesium, calcium, lithium, chromium, tantalum, molybdenum, scandium, neodymium, iridium, alloy containing aluminum, aluminum nitride, alloys containing silver, tungsten, tungsten nitride, alloys containing copper, alloys containing molybdenum, titanium nitride, tantalum nitride, strontium ruthenium oxide, zinc oxide, indium tin oxide, tin oxide, indium oxide, gallium oxide, and indium zinc oxide. The conductive layer may be formed using a printing process, a sputtering process, a chemical vapor deposition process, a pulsed laser deposition (PLD) process, a vacuum deposition process, an atomic layer deposition (ALD) process, or the like.

The conductive layer may be formed of layers. For example, the conductive layer may include a titanium layer, an aluminum layer, a titanium layer (Ti/Al/Ti), or a combination thereof.

A photoresist layer may be formed on the conductive layer. The photoresist layer may be exposed and developed using a mask to form a photoresist pattern PR. The source drain conductive layer may be formed by etching the conductive layer using the photoresist pattern PR as an etching barrier. The photoresist pattern PR may be removed through a strip process or the like.

Since the opening ratio of the dummy pattern area 12 may be about 30% or more, even in case of using a low skew etchant such as an organic acid-based etching solution, sufficient etching may be performed so that no residues exist. Accordingly, even in case that the photoresist pattern PR is removed through a strip process, process residues may not remain.

By the second dummy pattern DP2 of the dummy pattern area 12, during the development of the photoresist layer in the edge area 11, a loading effect may be alleviated to reduce an influence of the edge area 11 on the panel area 20 and the active dummy area 13.

The active pattern ACT, the gate electrode GE, the source electrode SE, and the drain electrode DE in the panel area 20 may be included in a thin film transistor TFT. The dummy active pattern DACT, the dummy gate electrode DGE, the dummy source electrode DSE, and the dummy drain electrode DDE in the dummy active pattern 13 may be included in a dummy thin film transistor DTFT.

Figure 3D:
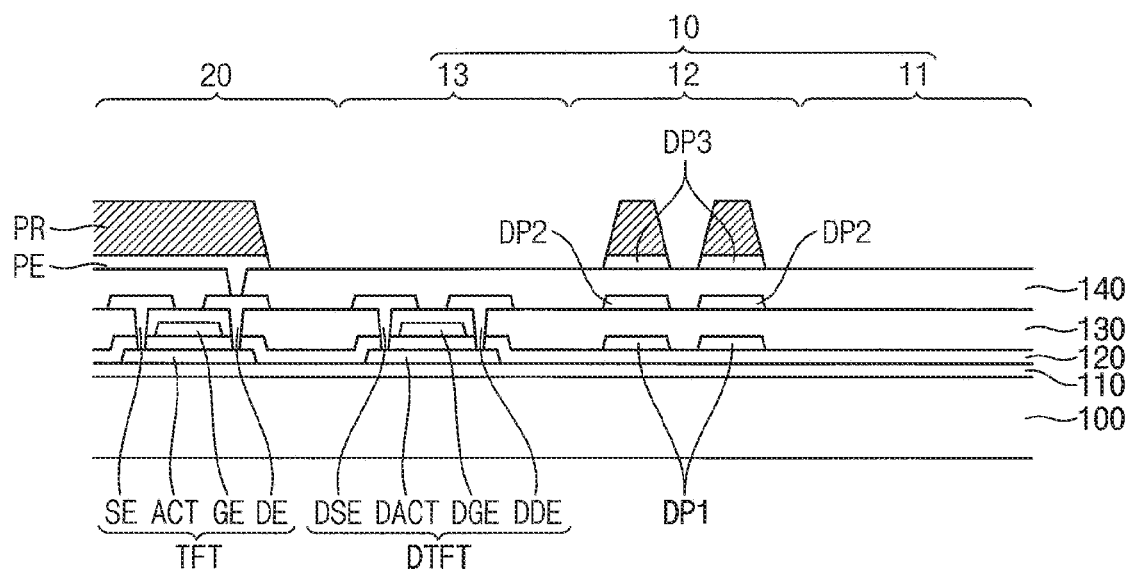

Referring to FIG. 3D, a third insulating layer 140 may be formed on the second insulating layer 130 on which the source drain conductive layer may be formed. The third insulating layer 140 may have a single-layer structure. In another embodiment, the third insulating layer 140 may have a multi-layer structure including at least two insulating layers. The third insulating layer 140 may be formed using an organic material such as a photoresist, an acrylic resin, a polyimide resin, a polyamide resin, or a siloxane-based resin. According to other embodiments, the third insulating layer 140 may be formed using an inorganic material such as a silicon compound, metal, metal oxide, or the like.

A pixel conductive layer may be formed on the third insulating layer 140. The pixel conductive layer may include a pixel electrode PE in the panel area 20 and a third dummy pattern DP3 in the dummy pattern area 12.

For example, a conductive layer may be formed on the third insulating layer 140. The conductive layer may include at least one of gold, silver, aluminum, platinum, nickel, titanium, palladium, magnesium, calcium, lithium, chromium, tantalum, molybdenum, scandium, neodymium, iridium, alloy containing aluminum, aluminum nitride, alloys containing silver, tungsten, tungsten nitride, alloys containing copper, alloys containing molybdenum, titanium nitride, tantalum nitride, strontium ruthenium oxide, zinc oxide, indium tin oxide, tin oxide, indium oxide, gallium oxide, and indium zinc oxide. The conductive layer may be formed using a printing process, a sputtering process, a chemical vapor deposition process, a pulsed laser deposition (PLD) process, a vacuum deposition process, an atomic layer deposition (ALD) process, or the like.

The conductive layer may be formed of layers. For example, the conductive layer may include a silver layer and an indium tin oxide layer (Ag/ITO or ITO/Ag), or may include an indium tin oxide layer, a silver layer, and an indium tin oxide layer (ITO/Ag/ITO).

A photoresist layer may be formed on the conductive layer. The photoresist layer may be exposed and developed using a mask to form a photoresist pattern PR. The pixel conductive layer may be formed by etching the conductive layer using the photoresist pattern PR as an etch barrier. The photoresist pattern PR may be removed through a strip process.

Since the opening ratio of the dummy pattern area 12 may be about 30% or more, even in case of using a low skew etchant such as an organic acid-based etching solution, sufficient etching may be performed so that a residue does not exist. Even in case that the resist pattern PR is removed through a strip process, process residues may not remain. For example, in case that the conductive layer includes silver (Ag), the silver particles (Ag particles) as a residue may affect the subsequent process, thereby reducing the display quality. However, an opening ratio of the dummy pattern area of about 30% or more can solve this problem.

By the second dummy pattern DP2 of the dummy pattern area 12, during the development of the photoresist layer in the edge area 11, a loading effect may be alleviated to reduce an influence of the edge area 11 on the panel area 20.

Figure 3E:
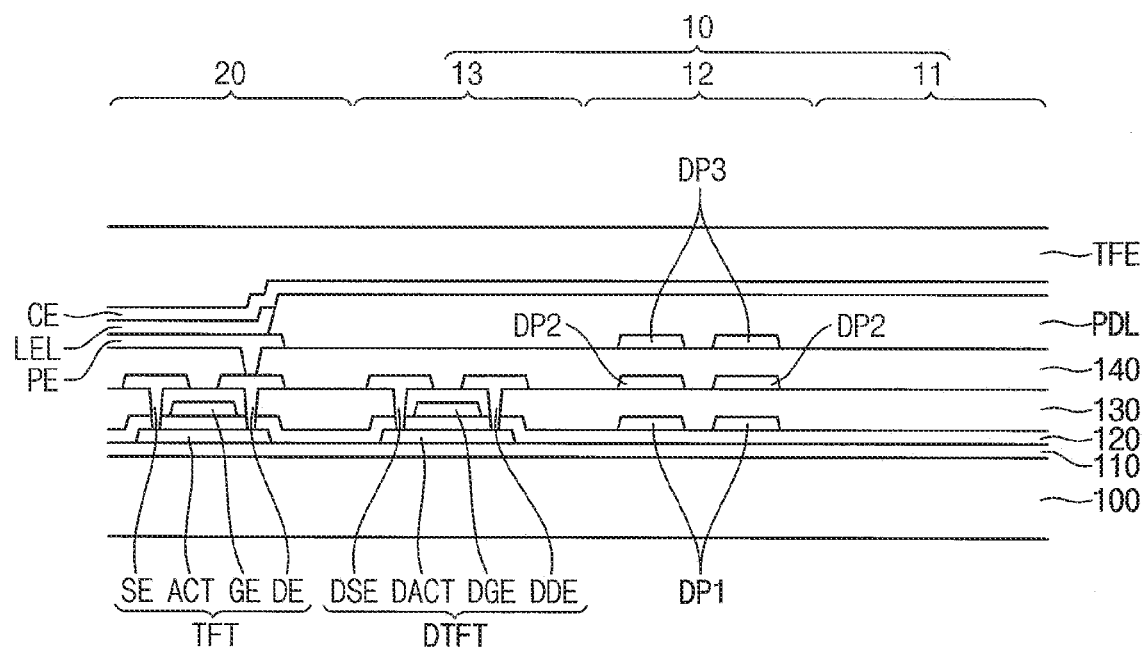

Referring to FIG. 3E, a pixel defining layer PDL may be formed on the third insulating layer 140 on which the pixel conductive layer may be formed.

The pixel defining layer PDL may be formed on the third insulating layer 140 on which the pixel electrode PE may be disposed. The pixel defining layer PDL may be formed using an organic material, an inorganic material, or the like. For example, the pixel defining layer PDL may be formed using a photoresist, a polyacrylic resin, a polyimide resin, an acrylic resin, a silicon compound, or the like.

According to an embodiment, the pixel defining layer PDL may be etched to form an opening that partially exposes the pixel electrode PE. An emitting area and a non-emitting area of the display apparatus may be defined by the opening of the pixel defining layer PDL. For example, a portion where the opening of the pixel defining layer PDL may be located may correspond to the emitting area, and the non-emitting area may correspond to a portion adjacent to the opening of the pixel defining layer PDL.

A light emitting layer LEL may be disposed on the first electrode PE exposed through the opening of the pixel defining layer PDL. The light emitting layer LEL may extend on a sidewall of the opening of the pixel defining layer PE. In some embodiments, the light emitting layer LEL may include an organic light emitting layer (EL), a hole injection layer (HIL), a hole transfer layer (HTL), an electron transfer layer (ETL), an electron injection layer (EIL), etc. In some embodiments, except for the organic emission layer, the hole injection layer, the hole transport layer, the electron transport layer, and the electron injection layer may be formed in common to correspond to multiple pixels. In some embodiments, organic light emitting layers may be formed using light emitting materials for generating different colors of light such as red, green and blue in accordance with color pixels of the display device. In some embodiments, the organic light emitting layer of the of the light emitting layer LEL may include stacked light emitting materials for generating different colors of light such as red, green and blue to thereby emit white light. Elements of the light emitting layer LEL may be commonly formed so as to correspond to multiple pixels, and each pixel can be divided by a color filter layer.

An opposite electrode CE may be disposed on the pixel defining layer PDL and the light emitting layer LEL. The opposite electrode CE may include a transmissive material or a reflective material in accordance with the emission type of the display device. For example, the opposite electrode CE may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or a combination thereof. In some embodiments, the opposite electrode CE may also have a single layer structure or a multi layer structure, which may include a metal film, an alloy film, a metal nitride film, a conductive metal oxide film and/or a transparent conductive film.

The pixel electrode PE, the light emitting layer LEL, and the opposite electrode CE may form a light emitting structure.

A thin film encapsulation layer TFE may be disposed on the light emitting structure. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. In an embodiment, the thin film encapsulation layer TFE may include a first inorganic layer, a second inorganic layer, and an organic layer between the first inorganic layer and the second inorganic layer. In another embodiment, a sealing substrate may be provided to block outside air and moisture from penetrating into the display apparatus instead of the thin film encapsulation layer.

The margin area 10 of the base substrate 100 may be cut to separate the margin area 10 from the panel area 20 to manufacture a display apparatus corresponding to the panel area 20.

Figure 4A:
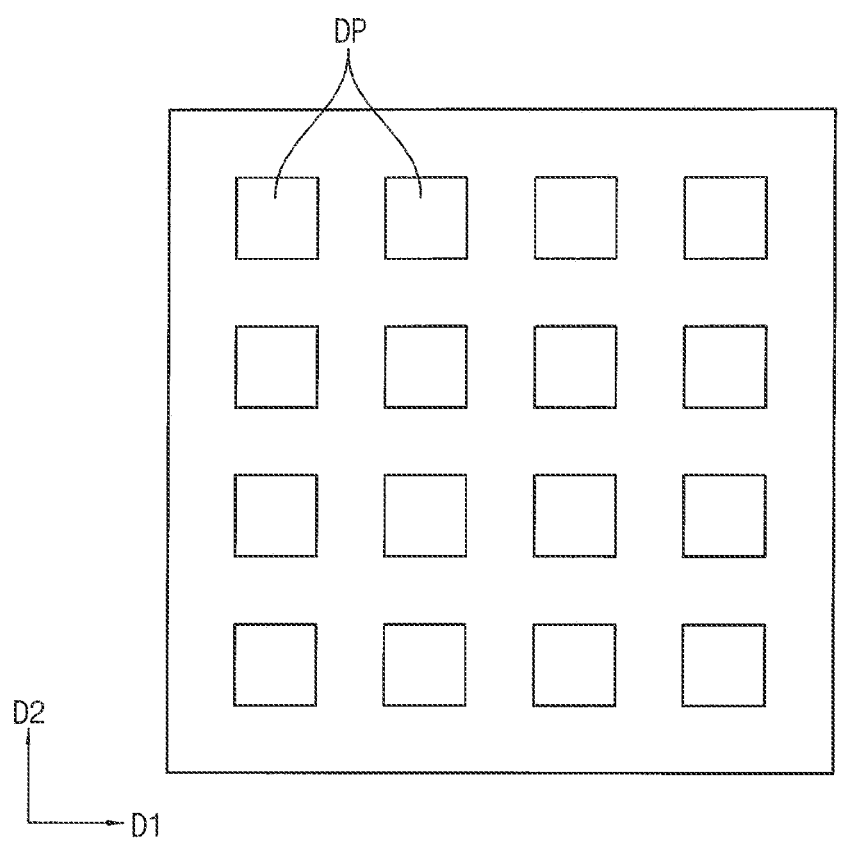
FIGS. 4A to 4C are partially enlarged schematic plan views illustrating embodiments of a dummy pattern in a dummy pattern area of a margin area of a mother substrate in a method of manufacturing a display apparatus according to an embodiment.
Figure 4B:
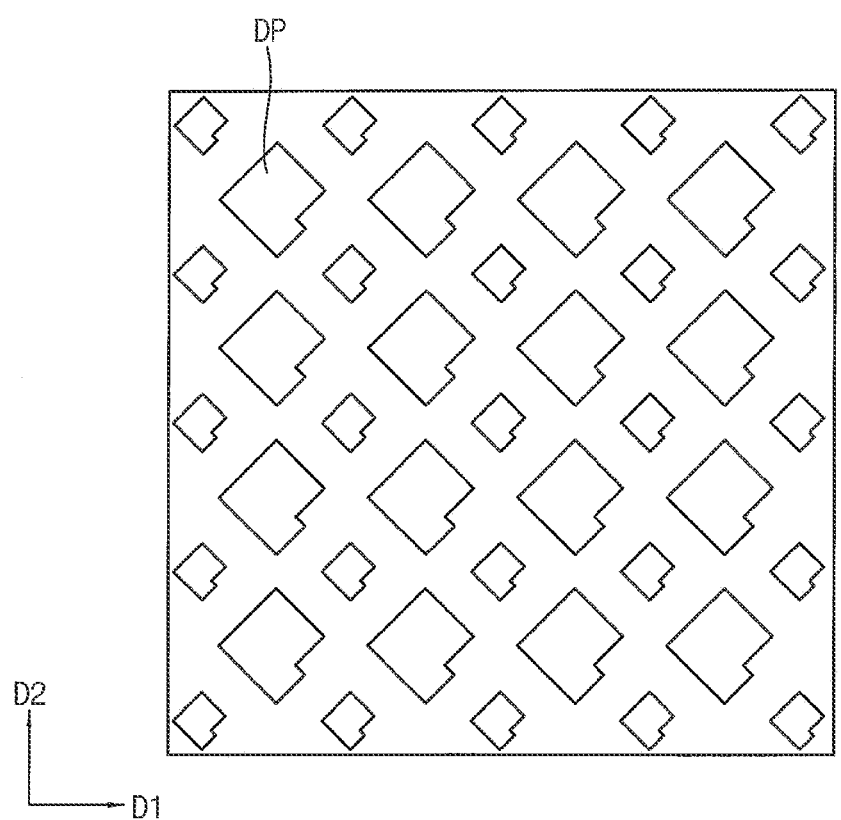
Figure 4C:
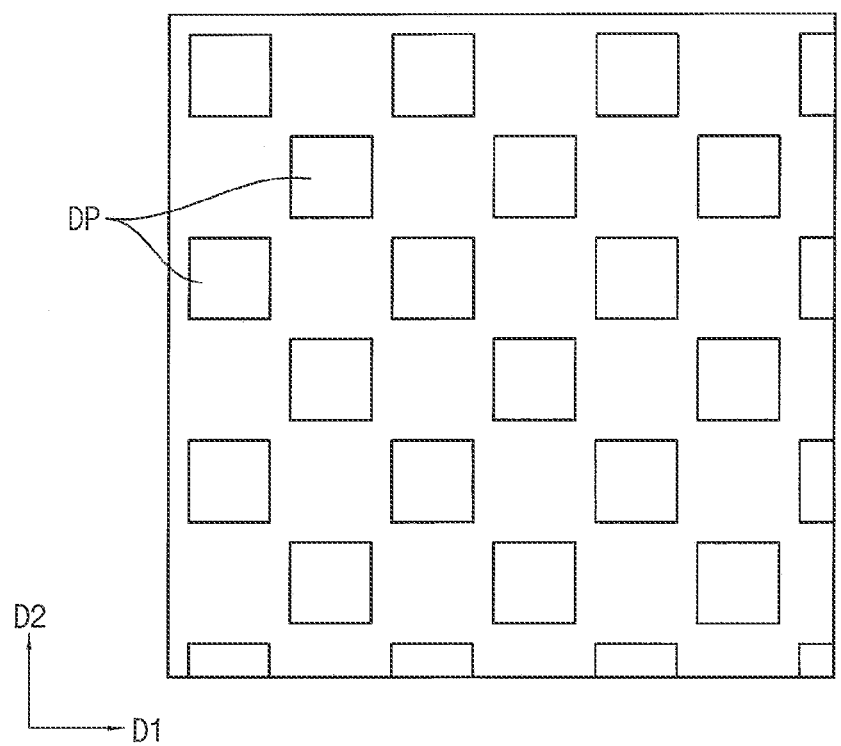

FIGS. 4A to 4C are partially enlarged schematic plan views illustrating embodiments of a dummy pattern DP in a dummy pattern area of a margin area of a mother substrate in a method of manufacturing a display apparatus according to an embodiment.

Referring to FIG. 4A, a dummy pattern DP may have a shape in which multiple rectangles may be arranged along a first direction D1 and a second direction D2 perpendicular to the first direction D1. Each of the rectangles may include sides extending along the first direction D1 and the second direction D2. A distance between the neighboring rectangles of the dummy pattern may be 20 um (micrometer) or more.

Referring to FIG. 4B, a dummy pattern DP may be repeatedly arranged along a first direction D1 and a second direction D2 perpendicular to the first direction D1. For example, the dummy pattern DP may have the same pattern as a shape of pixel electrodes corresponding to multiple pixels.

Referring to FIG. 4C, a dummy pattern DP may have a shape that multiple rectangles may be arranged alternately along a first direction D1 and a second direction D2 perpendicular to the first direction D1.

FIGS. 4A to 4C illustrates some examples of the shape of the dummy pattern DP, but the disclosure is not limited thereto. The dummy pattern DP may have various shapes having an opening ratio of about 30% or more in the dummy pattern area.

Figure 5:
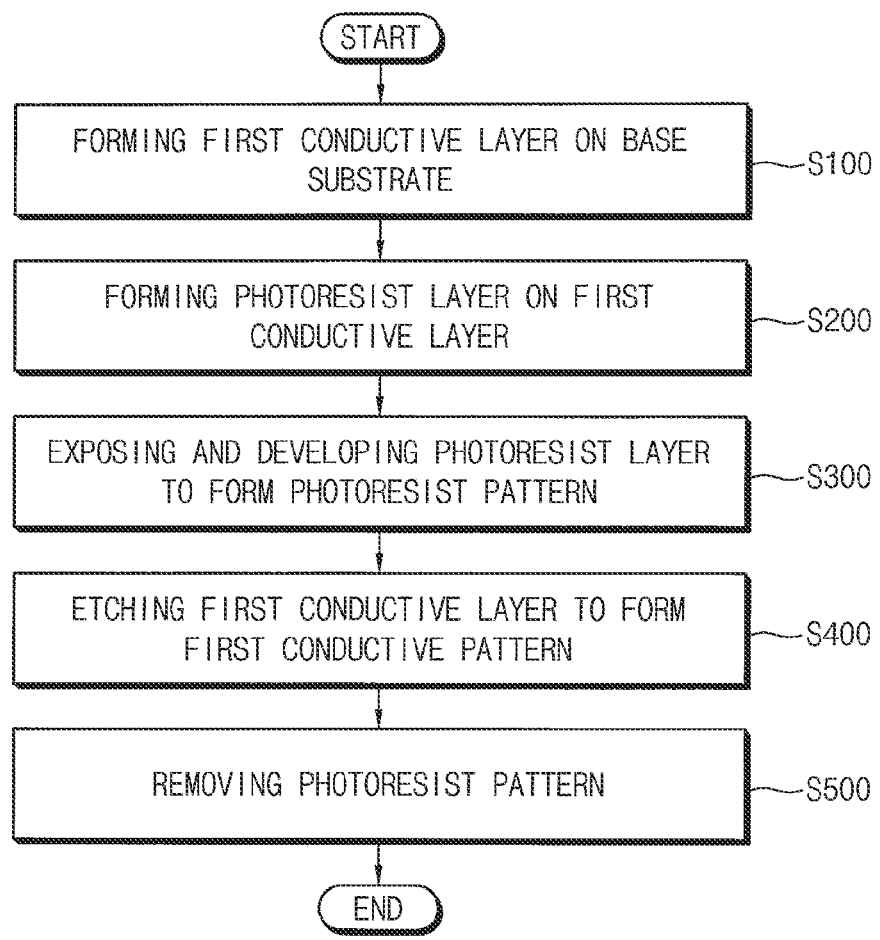
FIG. 5 is a flowchart schematically illustrating a method of manufacturing a display apparatus according to an embodiment.

FIG. 5 is a flowchart schematically illustrating a method of manufacturing a display apparatus according to an embodiment.

Referring to FIG. 5, the method of manufacturing the display apparatus may include forming a first conductive layer on base substrate (S100), forming a photoresist layer on first conductive layer (S200), exposing and developing the photoresist layer to form a photoresist pattern (S300), etching the first conductive layer to form a first conductive pattern (S400), and removing the photoresist pattern (S500).

In forming the first conductive layer on base substrate (S100), the first conductive layer may be formed on a base substrate including a panel area and the margin area surrounding the panel area. The margin area may include a dummy pattern area and a dummy active area.

In forming the photoresist layer on first conductive layer (S200), the photoresist layer may be formed on the first conductive layer.

In exposing and developing the photoresist layer to form a photoresist pattern (S300), the photoresist layer may be exposed and developed to form the photoresist pattern.

In etching the first conductive layer to form a first conductive pattern (S400), the first conductive layer may be etched using the photoresist pattern as an etch barrier to form the first conductive pattern including a first pixel circuit pattern in the panel region and a dummy pattern in the margin region. The first conductive layer may be etched using the photoresist pattern as an etch barrier to form the first conductive pattern including a first pixel circuit pattern in the panel area and a dummy pattern in the margin area. The first conductive layer may be wet-etched using an organic acid etchant. The first pixel circuit pattern of the first conductive pattern may include a gate electrode or source and drain electrodes of the thin film transistor. The first pixel circuit pattern of the first conductive pattern may include a pixel electrode electrically connected to the thin film transistor.

The dummy pattern may be formed in the dummy pattern area. An opening ratio, which may be a ratio of a portion where the dummy pattern is not formed with respect to the dummy pattern area, may be about 30% or more. The opening ratio of the dummy pattern area may be about 60% or less. The dummy pattern may have a repeating pattern and may be uniformly formed with respect to the entire dummy pattern area. The dummy pattern may have a shape in which multiple rectangles may be arranged along a first direction and a second direction perpendicular to the first direction. A distance between neighboring rectangles of the dummy pattern may be more than about 20 μm (micrometer).

In removing the photoresist pattern (S500), the photoresist pattern may be removed through a strip process or the like.

The manufacturing method may further include forming an active layer on the base substrate which may include an active pattern of a thin film transistor in the panel area and a dummy active pattern in the dummy active area.

The manufacturing method may further include forming a light emitting layer and an opposite electrode on the pixel electrode.

The manufacturing method may further include forming an insulating layer on the first insulating pattern, and forming a second conductive pattern on the insulating layer. The second conductive pattern may include a second pixel circuit pattern formed in the panel area and a second dummy pattern formed in the dummy pattern area of the margin area.

The method may further include cutting the margin area of the base substrate to separate the margin area from the panel area.

Figure 6A:
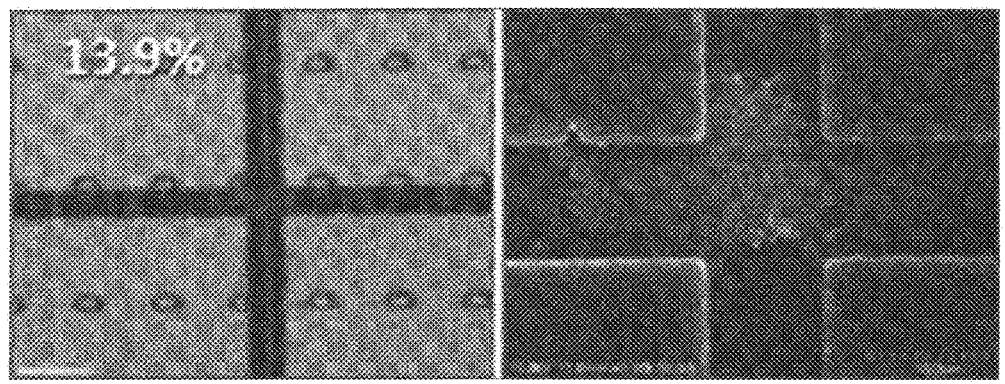
FIGS. 6A and 6B are photographs showing a state in which a defect occurs in a dummy pattern area of a display apparatus according to a comparative example.
Figure 6B:
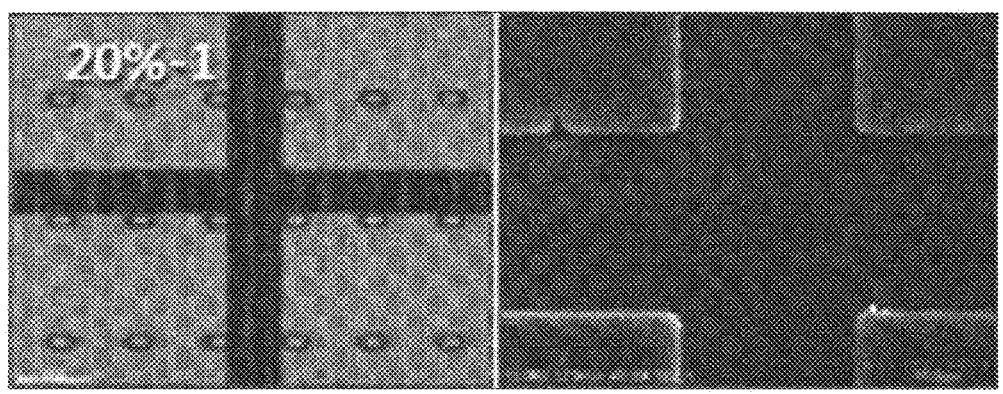

FIGS. 6A and 6B are photographs showing a state in which a defect occurs in a dummy pattern area of a display apparatus according to a comparative example.

Referring to FIGS. 2, 6A and 6B, FIGS. 6A and 6B are cases showing opening ratios of 13.9% and 20% of the dummy pattern area 12, respectively. FIGS. 6A and 6B each include enlarged photographs and electron microscope photographs of a corner portion of the dummy pattern DP.

In case that the opening ratio is more than about 30%, it may be confirmed that the failure does not occur. As shown in FIGS. 6A and 6B, in case that the opening ratio is less than about 30%, pattern defects may occur, residues may be formed, and the residues may affect a subsequent process, so that a quality of the display apparatus may be degraded.

As described above, in case that the opening ratio of the dummy pattern area 12 is less than about 30%, the portion where the dummy pattern may not be formed (e.g., the space between the rectangles) may be too narrow, so that a spacing of the photoresist pattern may be minutely formed. As a result, sufficient etching may not be performed and residues may be present, which may affect subsequent processes.

In case that the opening ratio is greater than about 60%, the amount of photoresist melted by the developer in the dummy pattern area may increase. In developing the photoresist layer, a function of the dummy pattern of alleviating a loading effect may be degraded.

The techniques herein can be applied to organic light emitting display devices and various electronic devices including the same. For example, the techniques can be applied to a mobile phone, a smart phone, a video phone, a smart pad, a smart watch, a tablet PC, a car navigation system, a television, a computer monitor, a notebook, and the like.

The foregoing is illustrative of the embodiments and is not to be construed as limiting thereof. Although the embodiments have been described, those skilled in the art can appreciate that various modifications may be possible without materially departing from the novel teachings and advantages of the disclosure. Accordingly, all such modifications are intended to be included within the scope of the invention as claimed in the claims and the equivalents thereof.

What is claimed is:

1. A method of manufacturing a display apparatus comprising:
    forming a thin film transistor in a panel area on a base substrate including the panel area and a margin area disposed next to the panel area;
    forming a conductive layer on the base substrate on which the thin film transistor is formed;
    patterning the conductive layer to form a dummy pattern in the margin area and a pixel electrode electrically connected to the thin film transistor in the panel area;
    forming a light emitting layer and an opposite electrode on the pixel electrode; and
    cutting the margin area of the base substrate to separate the margin area from the panel area.

2. The method of claim 1, wherein the forming the conductive layer includes forming a layer containing silver (Ag).

3. The method of claim 1, wherein the patterning the conductive layer comprises:
    forming a photoresist layer on the conductive layer;
    forming a photoresist pattern by exposing and developing the photoresist layer; and
    forming the pixel electrode and the dummy pattern by etching the conductive layer using the photoresist pattern.

4. The method of claim 3, wherein the etching the conductive layer includes wet etching the conducive layer using an organic acid based etching solution.

* * * * *